United States Patent [19]
Yamamoto et al.

[11] Patent Number: 5,094,878
[45] Date of Patent: Mar. 10, 1992

[54] PROCESS FOR FORMING DIAMOND FILM

[75] Inventors: Minoru Yamamoto; Satoshi Nakamura; Nobuei Ito; Tadashi Hattori, all of Okazaki, Japan

[73] Assignee: Nippon Soken, Inc., Nishio, Japan

[21] Appl. No.: 540,595

[22] Filed: Jun. 19, 1990

[30] Foreign Application Priority Data

Jun. 21, 1989 [JP] Japan .................. 1-158713
May 22, 1990 [JP] Japan .................. 2-132226

[51] Int. Cl.$^5$ ............................... B05D 3/06
[52] U.S. Cl. ........................... 427/37; 427/38
[58] Field of Search .................... 427/38, 37

[56] References Cited

U.S. PATENT DOCUMENTS 4,740,263  4/1988  Imai et al. .................. 156/163
4,851,254  7/1989  Yamamoto et al. ........... 427/37

FOREIGN PATENT DOCUMENTS 60-221395  11/1985  Japan .
60-55480   12/1985  Japan .
63-239194  10/1988  Japan .
1-93495     4/1989  Japan .

Primary Examiner—Bernard Pianalto
Attorney, Agent, or Firm—Cushman, Darby & Cushman

[57] ABSTRACT

A device for synthesizing a diamond at a high synthesis speed and obtaining an improved purity of diamond is provided, and is characterized by having a vacuum vessel maintained under a predetermined vacuum; a positive electrode and a negative electrode arranged within the vacuum vessel so as to be opposed to each other; an arc discharge power source electrically connected to the positive electrode and the negative electrode and applying a predetermined power to cause an arc discharge in a space between the positive electrode and the negative electrode; a gas supply source which generates a gas plasma by flowing a plasma source gas over the arc discharge, and blowing a resulting gas plasma containing a carbon source gas over a substrate arranged downstream thereof; an electrical field application power source for applying an electrical field between an area at which the gas plasma is generated and the substrate, to give the substrate a higher potential and thereby provide a flow of a predetermined amount of current therebetween.

4 Claims, 7 Drawing Sheets

PROCESS FOR FORMING DIAMOND FILM

BACKGROUND OF THE INVENTION

1. Field of the Invention

This invention relates to a device and a process for forming a diamond film, particularly to a device and a process for a gas phase synthesis of a diamond film utilizing an arc discharge.

2. Description of the Prior Art

Proposals have been made for a low pressure gas phase synthesis of a diamond film, and these proposed synthesis processes can be broadly classified into the three categories shown below.

First is the hot filament CVD process, which comprises providing a tungsten filament immediately above a substrate heated to 800 to 1000° C., heating the filament to 2000° C. or higher, and blowing hydrogen and a hydrocarbon gas (e.g., $CH_4$) through the filament against the substrate to thereby form a diamond film on the substrate. Second is the microwave plasma CVD process, which comprises generating a plasma in a gas mixture of hydrogen and hydrocarbon gas by using a microwave of several hundred watts, and growing diamond on a substrate located within the plasma. The substrate is heated by the microwave to have a temperature of 700° to 900° C.

In the above synthesis processes of the hydrogen atoms play an important role, in that hydrogen atoms promote a decomposition of $CH_4$, and further, effect a selective etching of synthetic components other than diamond, such as amorphous carbon. Third is the synthesis process using an ion beam, by which a diamond film is grown impinging an ion beam of carbon against a substrate.

The diamond film forming processes proposed of the prior art as mentioned above have the following problems Namely, the hot filament CVD process is not satisfactory because of the many occurrences of wire breakages caused by bringing the filament to a high temperature. Also, since the melting point of tungsten is up to about 2000° C., wire breakages will occur when the temperature of the filament is made higher than that, and therefore, a sufficient gas decomposition can not be obtained. In the synthesis process using a microwave plasma, it is difficult to apply same to a sample having a large area because of a limited dimension of the plasma chamber, and because the starting gas, particularly hydrogen, is not sufficiently decomposed. Also, the synthesis process using an ion beam has a problem in that a formed diamond contains many impurities such as amorphous carbon, etc.

Prior Work

The present inventors have proposed a synthesis process for forming a diamond on the substrate by generating an arc discharge between opposed electrodes, permitting the starting gases to pass through the arc discharge to form a gas plasma, forming the gas plasma into a plasma jet gas through a throttle, and blowing the plasma jet gas against a substrate, to thereby deposit a diamond on the substrate, see U.S. application Ser. No. 142813, now U.S. Pat. No. 4,851,254.

In this synthesis process, however, although the synthesis speed is remarkably improved, to improve the purity of the diamond film, the concentration of the introduced hydrocarbon relative to the hydrogen must be lowered, and thus the synthesis speed is lowered.

Briefly, as shown by the data in FIG. 8, a problem exists in that, although by lowering the hydrocarbon concentration the thermal diffusion rate (purity) of the diamond film synthesized is improved, nevertheless the synthesis speed is lowered.

SUMMARY OF THE INVENTION

The present invention is intended to solve the above problems, and an object thereof is to provide a device and a process for forming a diamond film, by which the synthesis speed is increased but a diamond film having a high purity is formed.

To accomplish the above object, in the present invention, a plasma gas jet system is employed which generates a gas plasma by permitting at least a plasma source gas to flow into an arc discharge, and blows the above-mentioned gas plasma containing a carbon source gas against a substrate arranged downstream thereof to thereby to deposit and form a diamond film on the substrate. The present invention is characterized in that an electrical field is applied between the region at which the above gas plasma is generated and the above substrate, and only a predetermined amount of current allowed to flow therebetween.

DESCRIPTION OF THE PREFERRED EMBODIMENTS

Figure 1:
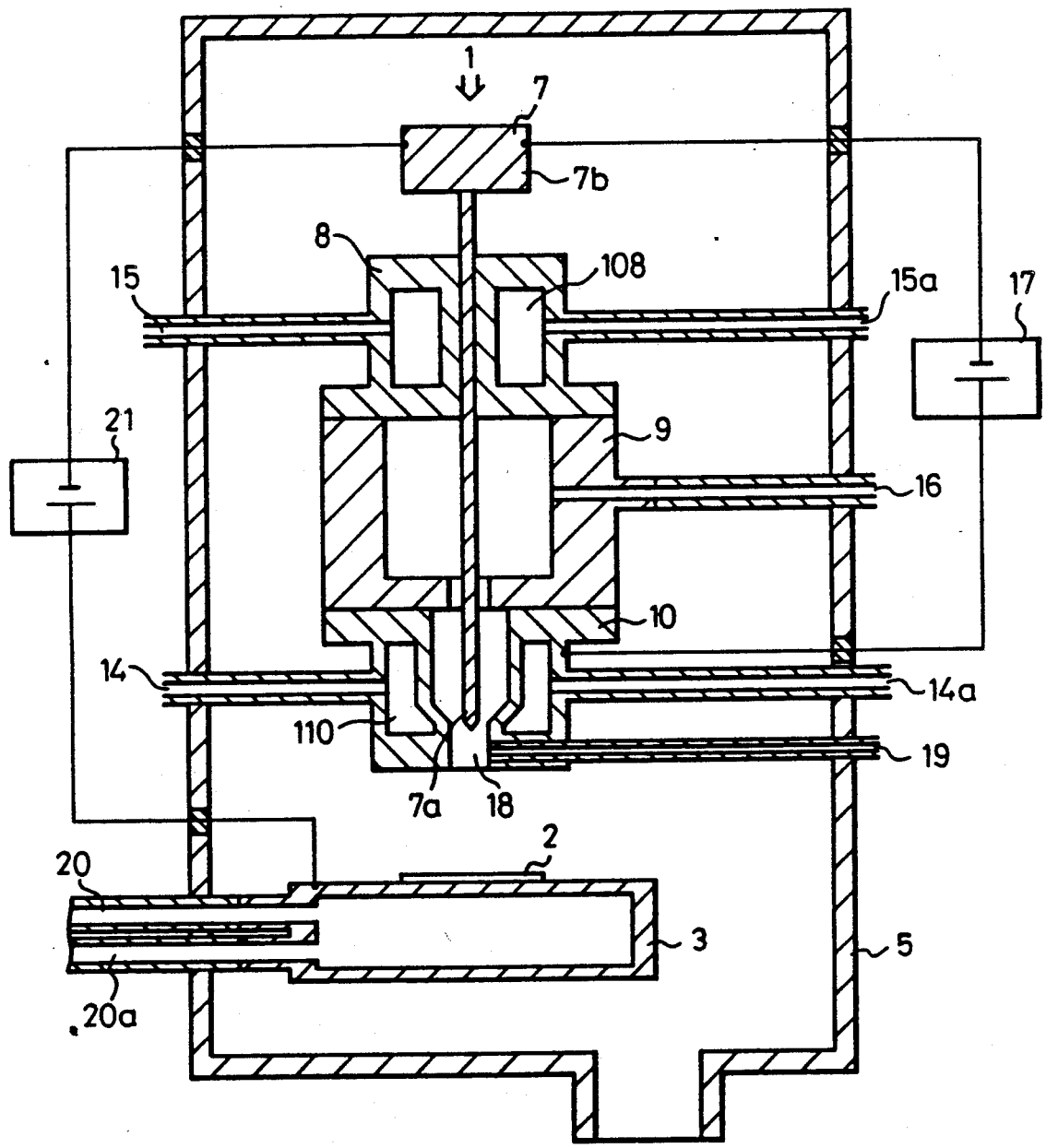
FIG. 1 is a sectional view of the device for forming a diamond film of the first example of the present invention.

FIG. 1 shows a sectional view of the device of the first example to be used in the present invention, wherein a substrate supporting stand 3 comprising a plasma jet gun 1, a substrate 2, and copper is provided within a vacuum vessel 5, which is maintained under a predetermined vacuum of from 5 Torr to 5 atm.

The plasma jet gun 1 is provided with an electrode cooling portion 8 made of copper a gas introducing portion 9 of teflon, and a cylindrical electrode 10 of copper, arranged from the flange portion 7b toward a tip portion 7a, with a rod-shaped electrode 7 made of tungsten and having one end having a tip portion 7a with a sharp angle and the other end having the flange portion 7b, as the axis. The electrode cooling portion 8 and the cylindrical electrode 10 are provided with hollow portions 108 and 110, and cooling water supplied from a cooling water pipe 14 connected to the cylindrical electrode 10 flows from the hollow portion 110 of the cylindrical electrode 10 into the cooling water channel 14a. The cooling water supplied from the cooling water pipe 15 connected to the electrode cooler 8 is supplied to the hollow portion 108 of the electrode cooler 8 and discharged from the cooling water pipe 15a connected to the electrode cooler 8. Due to the flow of this cooling water, electrode loss due to the heat of the arc discharge generated between the rod-shaped electrode 7 and the cylindrical electrode 10 is prevented. The gas introducing portion 9 is provided with a starting gas introducing pipe 16 and is open at one end of the rod-shaped electrode 7, in such a manner that the gas supplied from the gas introducing pipe 16 is delivered to the top portion 7a of the rod-shaped electrode 7. Further, to excite an arc discharge between the rod-shaped electrode 7 and the cylindrical electrode 10, the rod-shaped electrode 7 and the cylindrical electrode 10 are connected to an arc discharge power source 17. To effectively generate an arc discharge, the arc discharge power source 17, preferably forms the rod-shaped electrode having the tip portion 7a into a sharp angle negative potential. Also, on the surface opposite to the gas introducing portion 9 of the cylindrical electrode 10, there is provided a plasma jet outlet 18 as a throttle portion. The substrate 2 is placed on the substrate supporting stand 3, downstream of the plasma jet outlet 18. The substrate supporting stand 3 is hollow, to enable cooling water to be supplied from the cooling water pipe 20 and discharged from the cooling water pipe 20a and maintain the substrate at a predetermined temperature (about 800° C. in this example). This cooling necessary because the gas temperature of the plasma jet from the plasma jet outlet 18 reaches several thousands to several tens of thousands degrees, and therefore, the substrate 2 must be cooled to keep the substrate temperature at 600° to 1100° C., i.e., within a range at which diamond can be synthesized. The plasma jet outlet 18 is provided with a carbon gas introducing inlet 19.

A power source for the electrical field application 21 is electrically connected between the rod-shaped electrode 7 and the substrate supporting stand 3, and the distance between the plasma jet outlet 18 and the substrate 2 is 60 mm.

Next, the process for synthesizing the diamond film of this example is described. First, the vacuum vessel 5 is internally evacuated and then argon, which is a gas of the group 0 with a high ionization degree, is introduced from the gas introducing pipe 16 into the plasma jet gun 1, and the inner pressure in the vacuum vessel 5 is set at 20 Torr. An arc discharge is then generated by the arc discharge power source 17, between the rod-shaped electrode 7 (negative electrode) and the cylindrical electrode 10 (positive electrode), and when this discharge becomes stable, a gas mixture of 50 vol % of argon and 50 vol % of $H_2$ as the plasma source gas is permitted to flow from the gas introducing pipe 16 at a flow rate of 12 liters/min, to form a gas plasma. Further, a gas mixture of 240 cc/min and hydrogen gas of 60 cc/min is introduced from the carbon source gas introducing inlet 19. Here, hydrocarbon gas as the carbon source gas represented by methane gas also may be introduced from the actuation gas introducing pipe 16, but this has a drawback in that the tungsten electrode rod is carbonized and discharge does not become stable for a long time, and thus preferably the hydrocarbon gas is introduced from the gas introducing inlet 19 downstream of the discharge portion. The vacuum vessel 15 is then evacuated to maintain the pressure therein at 20 Torr, and an arc discharge is effected under the conditions of a voltage of 40 V and currents of 40 A, 60 A, and 80 A. The gas plasma is passed through the plasma jet outlet 18, to form a plasma jet, and methane gas introduced from the carbon source gas introducing inlet 19 is blown against the plasma jet to thereby form a plasma jet gas. Further, an electrical field is applied by an electrical field application power source 21, which is a direct current power source between the plasma jet outlet 18 and the substrate 2, and by using a voltage of 100 V and a current of 3 A, the potential on the substrate 2 side is made positive. Then, the reddish purple plasma jet gas is blown over the substrate 2, and a diamond is formed by precipitation onto the substrate 2.

Here, the temperature at the plasma center portion in the first example is 3000° C. or higher, and the temperature at the discharge portion inside the gun is raised to a temperature higher than that.

The synthesis is performed under the conditions as described above for 30 minutes, and the matter adhered to the substrate 2 is observed. A tungsten metal plate is employed as the substrate 2, and the surface of the substrate 2 is first marked with fine flaws, by polishing, so that a diamond film can be readily synthesized thereon.

Figure 2A:
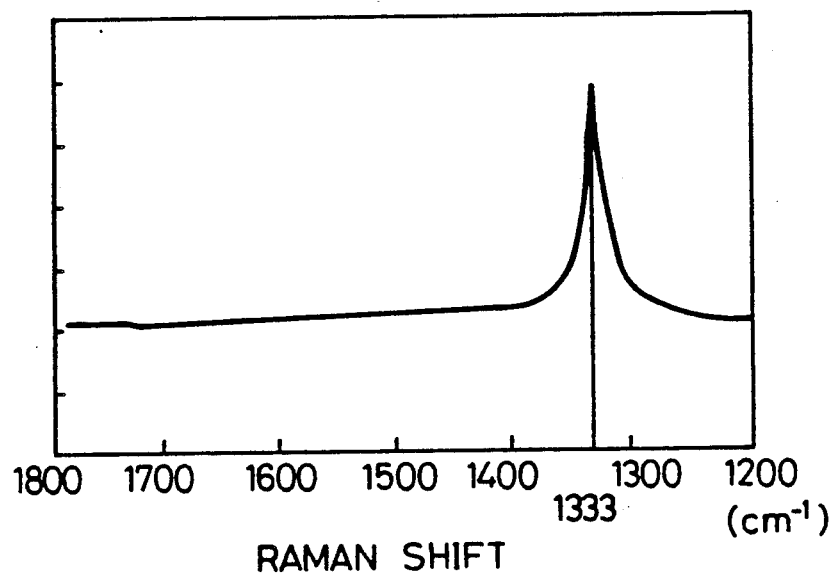
FIGS. 2A, 2B, 3A and 3B are characteristic curves representing Raman shifts and peak heights, respectively.
Figure 2B:
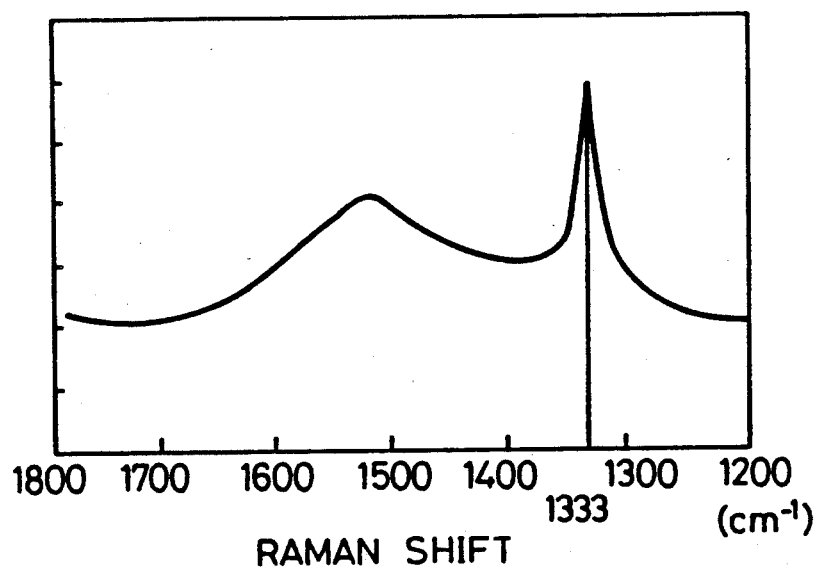

The adhered matter on the substrate 2 was deserved by a Raman spectroscopic device and an electron microscope, and FIG. 2A shows the characteristic curve of the relationship between the Raman shift and peak height in this example. FIG. 2B shows the characteristic curve of the Raman shift and peak height when an electrical field is not applied by the electrical field application power source 21 in the constitution shown in FIG. 1. As seen in FIG. 2A, a Raman peak indicating the presence of diamond with a Raman shift of around 1333 $cm^{-1}$ is confirmed from the Raman spectrum. Also, in FIG. 2B, the Raman spectrum clearly shows broad peaks of from 1400 $cm^{-1}$ to 1600 $cm^{-1}$, indicating the presence of graphite, amorphous carbon, and i-carbon, etc. From the results shown in FIGS. 2A and 2B, it can be understood that a diamond film having a high purity can be formed by a deposition due to an application of an electrical field from an electrical field application power source. Also, the observation with an electron microscope confirmed the crystal grain image, and should that the crystal form exhibited the same form as the diamond grains synthesized by the microwave plasma CVD method.

In the diamond synthesis experiment performed by the present inventors, using the microwave plasma CVD known in the art, the synthesis speed was 0.3 $\mu$m/Hr. In contrast, in the synthesis process of this example, the synthesis speed is 50 $\mu$m/Hr, thus proving that the synthesis can be carried out at a preferable higher speed.

Next, the reason why the diamond film of high purity can be formed by a deposition due to the application of an electrical field between the rod-shaped electrode 7 and the substrate supporting stand 3, as in the above-described example, is explained below on the basis of the results of experiments by the present inventors.

Figure 4:
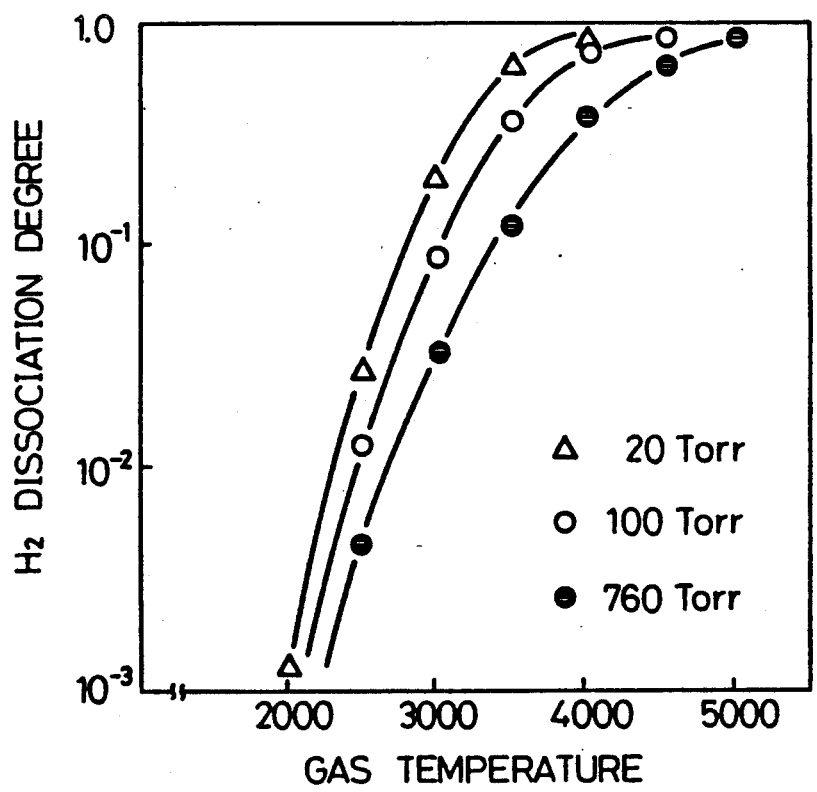
FIG. 4 is a graph showing the dissociation degree of hydrogen versus the gas temperature.

Here, in the diamond film synthesis process utilizing an arc discharge, a diamond film is synthesized by sufficiently decomposing gases with the heat energy obtained from an arc discharge, and generally the used gases are hydrocarbon and hydrogen. When the functions of the gases are considered, hydrocarbon is decomposed by plasma decomposition to form diamond, graphite, amorphous carbon, and i-carbon, but hydrogen is decomposed by plasma decomposition to become hydrogen radicals or hydrogen ions, etc. A hydrogen radical has a greater reducing power, and thus has, for example, the function of reducing and gasifying carbon to produce methane, etc. Briefly, the diamond, graphite, amorphous carbon, and i-carbon, etc., generated by a plasma decomposition of hydrocarbon are reduced by hydrogen radicals. Also, the removing abilities of the above-mentioned diamond, graphite, amorphous carbon, and i-carbon are different; the removing ability for diamond is far lower than the removing abilities for graphite, amorphous carbon, and i-carbon. Accordingly, in a diamond synthesis by plasma decomposition, as the result of a selective removal of graphite, amorphous carbon, and i-carbon, etc., other than diamond, only diamond is synthesized. Therefore, to improve the synthesis speed and purity of diamond, not only must the amount of hydrocarbon be increased, but also the decomposition (dissociation) of hydrogen must be improved. For example, the dissociation ratio of hydrogen versus the gas temperature can be calculated by statistical mechanics as shown by the graph in FIG. 4. From this graph, for example, at about two thousand and several hundred °K as in the hot filament process, hydrogen is not dissociated to several %. To effect a large dissociation of hydrogen, a gas temperature of at least three thousands °K is required, and as arc discharge provides a discharge in which a high density current flows through a space to give a gas temperature of several thousand to several tens thousand °K, it appears that hydrogen can be sufficiently dissociated thereby.

The electrons flowing through the gas plasma are accelerated toward the substrate 2 side by the application of an electrical field between the rod-shaped electrode 7 and the substrate support 3, and thus the energy of the electrons becomes greater. Further, during the collision of the electrons with the hydrogen, the energy thereat is absorbed by the hydrogen, whereby the hydrogen is decomposed, and is readily dissociated, which further contributes to the formation by precipitation of a diamond film having a high purity.

Figure 3A:
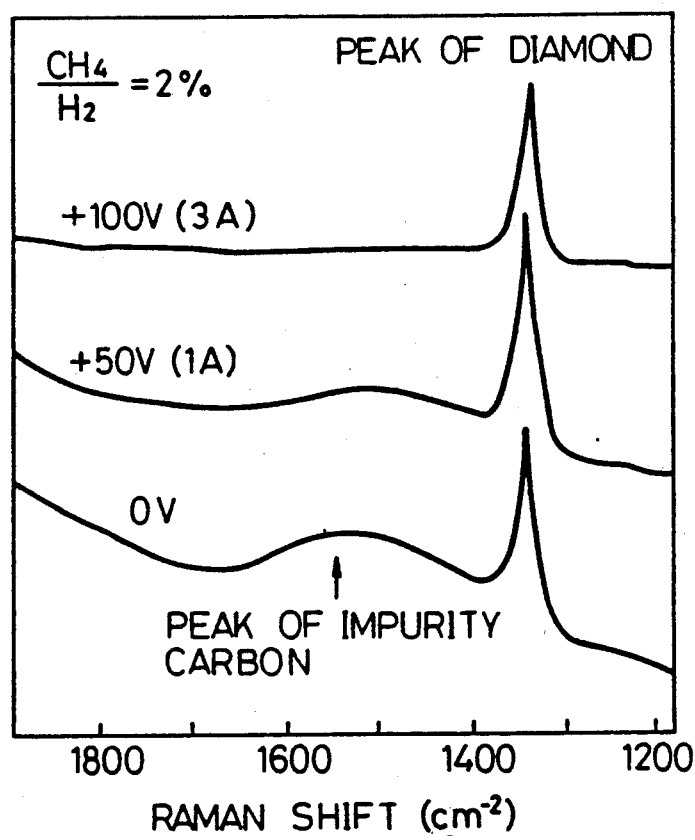
Figure 3B:
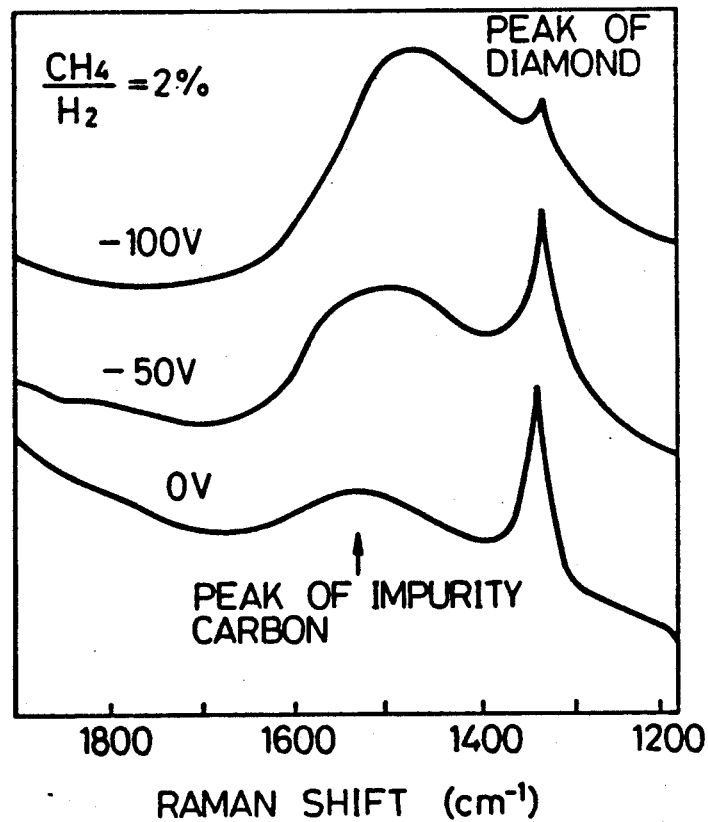

FIGS. 3A and 3B show characteristic curves of a Raman shift and peak height when the amount of current (electrical field) applied between the rod-shaped electrode 7 and the substrate support 3 is varied. FIG. 3A shows the characteristic curve when the substrate support 3 side is given a positive (higher) potential, and FIG. 3B that when the substrate support 3 is given a negative (lower) potential. As can be seen from FIG. 3B, substantially no current flows when the substrate support 3 is given a negative (lower) potential, and a broad peak from 1400 cm$^{-1}$ to 1600 cm$^{-1}$ appears from the Raman spectrum thereof to lower the purity of the diamond film. Therefore, the substrate support 3 side must be given a positive (higher) potential. Also, as can be seen from FIG. 3A, by making the current applied 1 A or higher (50 V or higher as electrical field), substantially no broad peak from 1400 cm$^{-1}$ to 1600 cm$^{-1}$ will appear, whereby a diamond film having a high purity can be obtained.

Here, the application of a bias permits a flow of current through the plasma, and preferably the value thereof is 1 A or higher, to obtain the required effect. Also, although the purity of the diamond film is improved as the value is increased, the upper limit value is preferably about 100 A, to be in balance with the substrate temperature.

Figure 5:
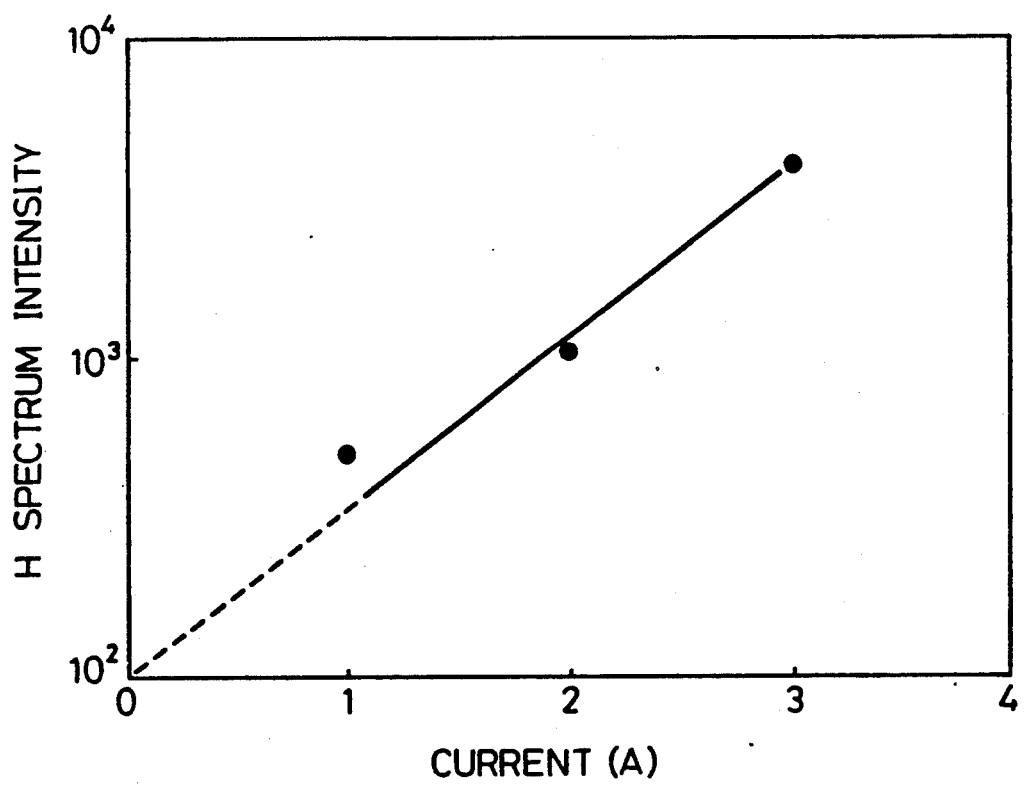
FIG. 5 is a graph of the relationship of the hydrogen dissociation amount at a position 5 mm above the substrate versus the amount of current passed through the plasma.

FIG. 5 shows the relationship between the hydrogen radical generating peak intensity at a point 5 mm above the substrate 2 and the current passed, from which it can be seen that the existing amount of hydrogen radicals is increased with an increase of the current. Briefly, the current passage through the gas plasma increases the amount of hydrogen dissociated around the substrate, and this increase of dissociated hydrogen improves the removing abilities of non-diamond carbon such as graphite, amorphous carbon, and i-carbon, other than diamond, to thereby improve the purity of diamond.

Figure 6:
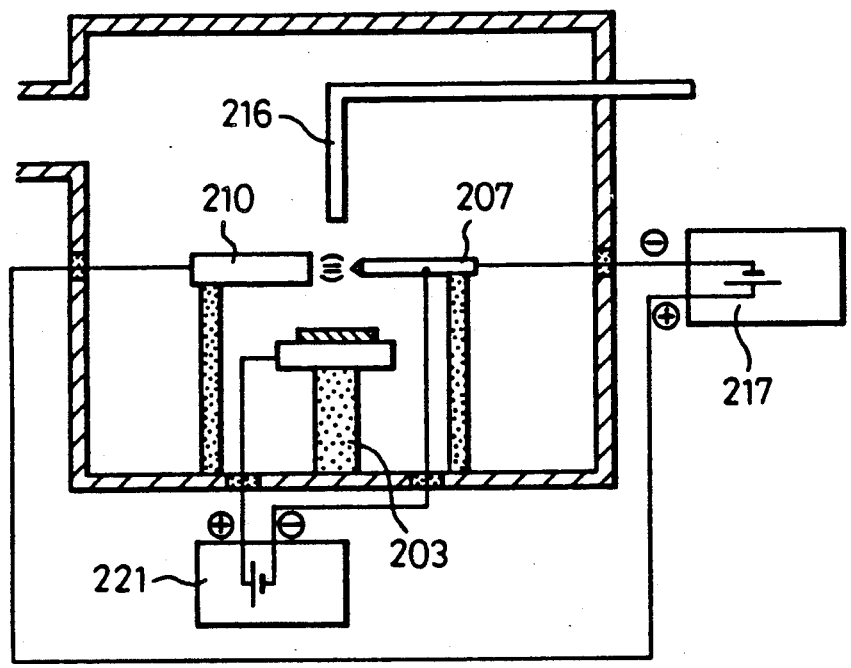
FIG. 6 is a sectional view of the device for forming a diamond film of the second example of the present invention.
Figure 8:
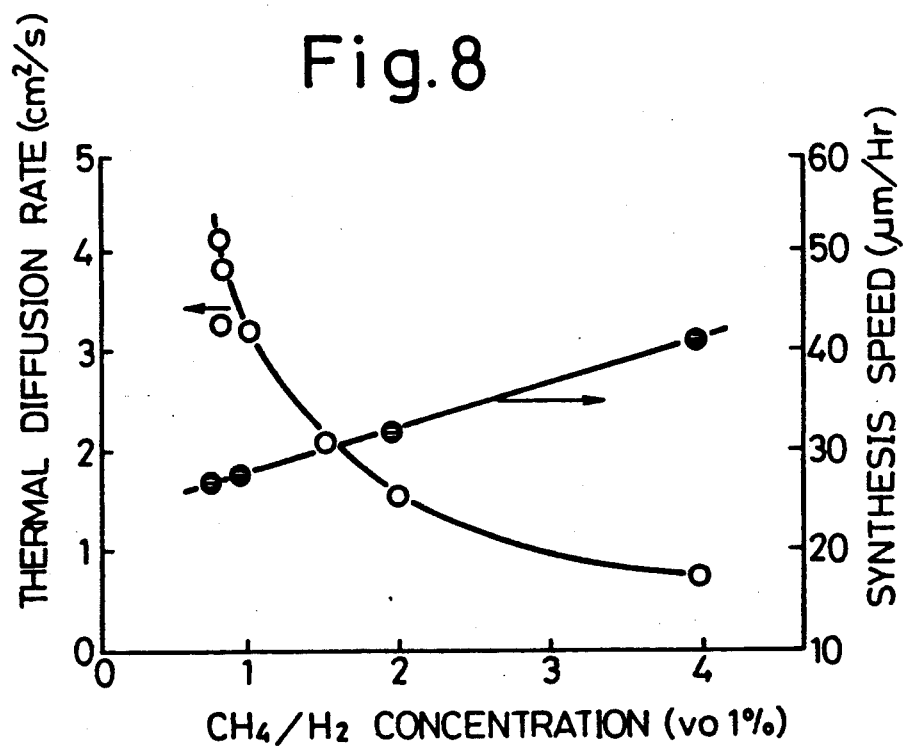
FIG. 8 is a graph showing the thermal diffusion ratio and synthesis speed versus the hydrocarbon concentration ($CH_4/H_2$).

Next, the second example of the present invention is described with reference to FIG. 6. In the above first example, an arc discharge plasma jet process is practiced, but the same effect can be obtained by an arc discharge process having a constitution as shown in FIG. 6. Briefly, an arc discharge is generated by the arc discharge power source 217 between the opposed electrodes 210 and 207, and a gas mixture of hydrogen, methane and argon is made to flow from the starting material gas introducing pipe 216, as the starting material gas containing a plasma source gas and a carbon source gas at the same ratio, at the same flow rate as in the first example. Next, an electrical field is applied by the electrical field application power source, 221 which is a direct current power source, between the substrate supporting stand 203 and the electrode 207 (or the electrode 210). The remaining conditions are the same as for the first example. Also, by using the device of this example, a diamond having a high purity can be synthesized in the same way as in the first example.

Figure 7:
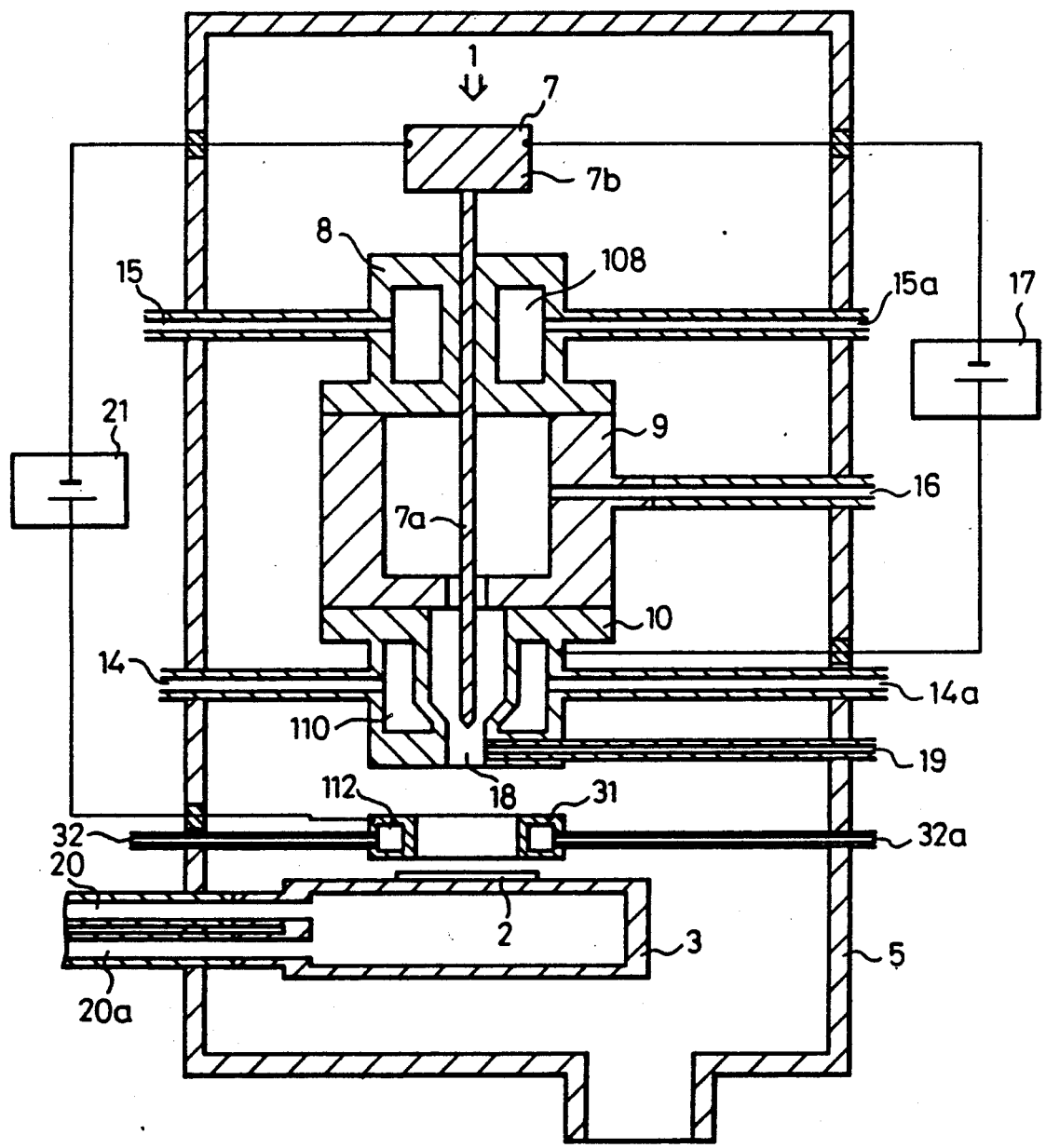
FIG. 7 is a sectional view of the device for forming a diamond film of the third example of the present invention.

Next, the third example of the present invention is described with reference to FIG. 7. In this constitution, a ring-shaped electrode is located between the plasma jet outlet 18 and the substrate, 2 as the third electrode 31, and is connected to the electrical field application power source 21. Briefly, in this example, current is made to flow through the plasma by the application of an electrical field between the rod-shaped electrode 7 and the third electrode 31. The third electrode 31 is made of copper has an inner diameter of $\phi$20 mm, and is cooled by flowing water into the hollow portion 112 from the cooling water introducing pipe 32. The third electrode 31 is positioned 5 to 10 mm above the substrate 2.

The diamond synthesis conditions are substantially the same as in the first example, but the current flowing between the rod-shaped electrode 7 and the third electrode 31 is 1 to 100 A. As a result of a synthesis of diamond under such conditions, a diamond having a high purity, as in the first example, is synthesized.

The synthesis of a diamond is possible when the distance between the above third electrode 3 and the substrate 2 is 1 to 100 mm, and the distance between the region at which the gas plasma is generated and the third electrode 31 is 5 to 100 mm.

The present invention has been described above with reference to first, second, and third examples thereof, but the present invention is not limited thereto, and various modifications are possible, as shown below, without departing from the spirit of the invention.

(1) In the first example, the negative (lower) potential side of the electrical field application power source 21 is connected to the rod-shaped electrode 7; it may be also connected to the cylindrical electrode 10.

(2) The positive (higher) potential side of the electrical field application power source 21 may be also directly connected to the substrate 2, or alternatively a mesh-like electrode may be arranged immediately above the substrate 2 and the positive (higher) potential side connected to this electrode. In essence, the electrical field must be applied from the substrate 2 toward the area at which the gas plasma is generated, to thereby permit a predetermined amount of current to flow through the gas plasma.

We claim:

1. A process for forming a diamond film, which comprises generating a gas plasma by flowing at least a plasma source gas over an arc discharge, and blowing a resulting gas plasma containing a carbon source gas over a substrate arranged downstream thereof to thereby deposit and form a diamond film on said substrate, characterized in that an electrical field is applied between a region at which said gas plasma is generated and said substrate to give said substrate a higher potential and thereby provide a flow of a predetermined amount of current therebetween.

2. A process for forming a diamond film as claimed in claim 1, wherein the value of said current is 1 to 100 A.

3. A process for forming a diamond film, which comprises generating a gas plasma by flowing at least a plasma source gas over an arc discharge, and blowing a resultant gas plasma containing a carbon source gas over a substrate arranged downstream thereof to thereby deposit and form a diamond film on said substrate, characterized in that a third electrode is located between a region at which said gas plasma is generated and said substrate, and an electrical field is applied between said third electrode and said region at which said gas plasma is generated to give said third electrode a higher potential and thereby provide a flow of a predetermined amount of current therebetween.

4. A process for forming a diamond film according to claim 3, wherein the value of said current is 1 to 100 A.

* * * * *

UNITED STATES PATENT AND TRADEMARK OFFICE
CERTIFICATE OF CORRECTION

PATENT NO. : 5,094,878

DATED : March 10, 1992

INVENTOR(S) : YAMAMOTO et al.

It is certified that error appears in the above-identified patent and that said Letters Patent is hereby corrected as shown below:

On the title page, item [22], please change the filed date from June 19, 1990 to June 20, 1990.

Signed and Sealed this

Thirteenth Day of December, 1994

*Attest:*

BRUCE LEHMAN

*Attesting Officer*  *Commissioner of Patents and Trademarks*